(12) United States Patent
Gu et al.

(10) Patent No.: US 7,705,268 B2
(45) Date of Patent: Apr. 27, 2010

(54) METHOD AND SYSTEM FOR LASER SOFT MARKING

(75) Inventors: Bo Gu, North Andover, MA (US); Jonathan S. Ehrmann, Sudbury, MA (US)

(73) Assignee: GSI Group Corporation, Bedford, MA (US)

( * ) Notice: Subject to any disclaimer, the term of this patent is extended or adjusted under 35 U.S.C. 154(b) by 403 days.

(21) Appl. No.: 11/270,109

(22) Filed: Nov. 9, 2005

(65) Prior Publication Data

US 2006/0108337 A1 May 25, 2006

Related U.S. Application Data

(60) Provisional application No. 60/627,760, filed on Nov. 11, 2004.

(51) Int. Cl.
  *B23K 26/36* (2006.01)
(52) U.S. Cl. ............... 219/121.69; 219/121.61; 219/121.68; 264/400
(58) Field of Classification Search ......... 219/121.61, 219/121.62, 121.68, 121.69; 700/166; 264/400
See application file for complete search history.

(56) References Cited

U.S. PATENT DOCUMENTS

| | | | |
|---|---|---|---|
| 4,156,124 A | 5/1979 | Macken et al. | |
| 4,220,842 A | 9/1980 | Sturmer et al. | |
| 4,261,919 A | 4/1981 | Knowles et al. | |
| 4,323,755 A | 4/1982 | Nierenberg | |
| 4,522,656 A | 6/1985 | Kuhn-Kuhnenfeld et al. | |
| 4,734,558 A | 3/1988 | Nakano et al. | |
| 4,758,848 A | 7/1988 | Nakano | |
| 4,856,053 A | 8/1989 | Hashimoto | |
| 4,922,077 A | 5/1990 | Gordon | |

(Continued)

FOREIGN PATENT DOCUMENTS

JP  2-59188 A  *  2/1990 ............ 219/121.61

(Continued)

OTHER PUBLICATIONS

Chiba et al., "Formation of Micropeak Array on a Silicon Wafer", 2000, Japan Journal of Applied Physics, vol. 39, pp. 4803-4810.*

(Continued)

*Primary Examiner*—Geoffrey S Evans
(74) *Attorney, Agent, or Firm*—Brooks Kushman P.C.

(57) ABSTRACT

Methods and systems for laser soft marking, especially for semiconductor wafers and devices, are provided. A laser-marking system for marking a semiconductor wafer to form a softmark on the wafer is provided. The system includes a laser subsystem for generating one or more laser pulses and a controller operatively connected to the laser subsystem. The controller sets a laser pulse width of the one or more laser pulses to selectively provide one or more laser output pulses having one or more set pulse widths that affect the depth of a softmark that is to be formed. The mark depth is substantially dependent on the one or more set pulse widths. The controller further sets a pulse energy of the one or more output pulses to selectively provide the one or more output pulses having a set total output energy that is within an acceptable process energy window for producing the softmark.

39 Claims, 8 Drawing Sheets

U.S. PATENT DOCUMENTS

| | | | |
|---|---|---|---|
| 4,945,204 | A | 7/1990 | Nakamura et al. |
| 4,985,780 | A | 1/1991 | Garnier et al. |
| 5,329,090 | A | 7/1994 | Woelki et al. |
| 5,357,077 | A | 10/1994 | Tsuruta |
| 5,521,628 | A | 5/1996 | Montgomery |
| 5,600,478 | A | 2/1997 | Stevens |
| 5,635,976 | A | 6/1997 | Thuren et al. |
| 5,690,846 | A | 11/1997 | Okada et al. |
| 5,719,372 | A | 2/1998 | Togari et al. |
| 5,737,122 | A | 4/1998 | Wilt et al. |
| 5,894,530 | A | 4/1999 | Wilt |
| 5,903,537 | A * | 5/1999 | Gage et al. ............... 369/116 |
| 5,929,997 | A | 7/1999 | Lin |
| 5,932,119 | A | 8/1999 | Kaplan et al. |
| 5,942,137 | A | 8/1999 | Kamir et al. |
| 5,949,584 | A * | 9/1999 | White et al. ............... 359/633 |
| 5,965,042 | A | 10/1999 | Saitoh |
| 5,969,374 | A * | 10/1999 | Toh ........................ 250/566 |
| 6,130,402 | A * | 10/2000 | Abella et al. ............ 219/121.68 |
| 6,160,568 | A * | 12/2000 | Brodsky et al. ............ 347/247 |
| 6,231,196 | B1 | 5/2001 | Mahachek |
| 6,248,973 | B1 | 6/2001 | Matsumura et al. |
| 6,261,382 | B1 * | 7/2001 | Marx et al. ............... 148/33.2 |
| 6,261,919 | B1 | 7/2001 | Omizo |
| 6,262,388 | B1 | 7/2001 | Canella et al. |
| 6,281,471 | B1 | 8/2001 | Smart |
| 6,309,943 | B1 | 10/2001 | Glenn et al. |
| 6,340,806 | B1 | 1/2002 | Smart et al. |
| 6,437,454 | B1 | 8/2002 | Chiba et al. |
| 6,483,071 | B1 | 11/2002 | Hunter et al. |
| 6,489,985 | B1 | 12/2002 | Brodsky et al. |
| 6,495,791 | B2 | 12/2002 | Hunter et al. |
| 6,573,473 | B2 | 6/2003 | Hunter et al. |
| 6,639,177 | B2 | 10/2003 | Ehrmann et al. |
| 6,662,063 | B2 | 12/2003 | Hunter et al. |
| 6,703,582 | B2 | 3/2004 | Smart et al. |
| 6,727,458 | B2 | 4/2004 | Smart |
| 6,774,340 | B1 | 8/2004 | Chiba et al. |
| 6,777,641 | B2 * | 8/2004 | Cole et al. ............ 219/121.67 |
| 6,777,645 | B2 | 8/2004 | Ehrmann et al. |
| 6,951,995 | B2 | 10/2005 | Couch et al. |
| 6,972,268 | B2 | 12/2005 | Ehrmann et al. |
| 6,989,508 | B2 | 1/2006 | Ehrmann et al. |
| 7,015,418 | B2 | 3/2006 | Cahill et al. |
| 7,027,155 | B2 | 4/2006 | Cordingley et al. |
| 7,119,351 | B2 | 10/2006 | Woelki |
| 7,148,447 | B2 | 12/2006 | Ehrmann et al. |
| 7,176,407 | B2 | 2/2007 | Hunter et al. |
| 7,192,846 | B2 | 3/2007 | Cordingley et al. |
| 7,358,157 | B2 | 4/2008 | Gu et al. |
| 2001/0038153 | A1 | 11/2001 | Sakaguchi |
| 2002/0167581 | A1 | 11/2002 | Cordingley et al. |
| 2003/0160034 | A1* | 8/2003 | Filgas et al. ............ 219/121.68 |
| 2004/0060910 | A1* | 4/2004 | Schramm ............... 219/121.69 |
| 2004/0134896 | A1 | 7/2004 | Gu et al. |
| 2004/0144760 | A1 | 7/2004 | Cahill et al. |
| 2004/0188399 | A1 | 9/2004 | Smart |
| 2005/0018738 | A1* | 1/2005 | Duan et al. ............... 372/55 |
| 2005/0199598 | A1 | 9/2005 | Hunter et al. |
| 2005/0233537 | A1 | 10/2005 | Couch et al. |
| 2006/0000814 | A1 | 1/2006 | Gu et al. |
| 2006/0028655 | A1 | 2/2006 | Cordingley et al. |
| 2006/0086702 | A1 | 4/2006 | Smart |
| 2006/0151704 | A1 | 7/2006 | Cordingley |
| 2006/0186096 | A1 | 8/2006 | Schramm |
| 2006/0189091 | A1 | 8/2006 | Gu |
| 2006/0191884 | A1 | 8/2006 | Johnson et al. |
| 2006/0192845 | A1 | 8/2006 | Cordingley et al. |
| 2006/0199354 | A1 | 9/2006 | Gu |
| 2006/0205121 | A1 | 9/2006 | Couch et al. |
| 2006/0207975 | A1 | 9/2006 | Ehrmann et al. |
| 2006/0216927 | A1 | 9/2006 | Cordingley et al. |
| 2006/0256181 | A1 | 11/2006 | Ehrmann et al. |
| 2007/0031993 | A1 | 2/2007 | Nemets et al. |
| 2007/0052791 | A1 | 3/2007 | Cordingley et al. |
| 2007/0075058 | A1 | 4/2007 | Ehrmann et al. |
| 2007/0106416 | A1 | 5/2007 | Griffiths et al. |
| 2007/0117227 | A1 | 5/2007 | Gu |
| 2007/0173075 | A1 | 7/2007 | Lee et al. |
| 2007/0178714 | A1 | 8/2007 | Gu et al. |
| 2007/0199927 | A1 | 8/2007 | Gu et al. |
| 2007/0215575 | A1 | 9/2007 | Gu et al. |
| 2007/0215820 | A1 | 9/2007 | Cordingley et al. |
| 2008/0011852 | A1 | 1/2008 | Gu et al. |
| 2008/0035614 | A1 | 2/2008 | Smart |
| 2008/0067155 | A1 | 3/2008 | Gu |
| 2008/0073438 | A1 | 3/2008 | Gu et al. |
| 2008/0094640 | A1 | 4/2008 | Cordingley et al. |

FOREIGN PATENT DOCUMENTS

| | | | |
|---|---|---|---|
| JP | 6-120096 A * | 4/1994 | |
| JP | 6-148026 A * | 5/1994 | |
| JP | 11135390 | 5/1999 | |
| JP | 2000-21696 A * | 1/2000 | |
| JP | 2002-164264 A * | 6/2002 | |
| JP | 2002-178172 A * | 6/2002 | |
| JP | 2002164264 A | 6/2002 | |
| WO | WO 96/16767 | 6/1996 | |
| WO | WO 98/53949 | 12/1998 | |
| WO | WO 01/54854 | 8/2001 | |
| WO | WO 01/61275 | 8/2001 | |

OTHER PUBLICATIONS

Computer translation of Japan Patent No. 6-120,096, Feb. 2009.*
Computer translation of Japan Patent No. 6-148,026, Feb. 2009.*
Computer translation of Japan Patent No. 2000-21,696, Feb. 2009.*
Computer translation of Japan Patent No. 2002-178,172, Feb. 2009.*
Machine Translation of Japan Patent No. 2002-164,264, Aug. 2009.*
Montagu, Laser Beam Scanning, Marcel-Dekker, 1985, pp. 214-216.
Hayes, Orlan, Marking Applications now Encompass Many Materials, Laser Focus World, Feb. 1997, pp. 153-160.
Rossi, Brian, Commercial Fiber Lasers Take on Industrial Markets, Laser Focus World, May 1997, pp. 143-150.
The First Office Action dated Feb. 6, 2009 of corresponding Chinese Patent Application Serial No. 20058046069.7 filed Jul. 5, 2007, pp. 1-3.
The Text of the First Office Action dated Feb. 6, 2009 of the corresponding Chinese Patent Application Serial No. 20058046069.7 filed Jul. 5, 2007, pp. 1-8.
Supplementary European Search Report; Application No. EP 05 82 0752; Date of completion of search Oct. 2, 2009.

* cited by examiner

BURST DURATIONS: $T_2 - T_1$
(WIDTHS) $T_4 - T_3$
TEMPORAL SPACING: $T_3 - T_2$ $t_2 - t_1$ : PULSE TEMPORAL SPACING
$t_4 - t_3$ : PULSE WIDTH $t_2 - t_1$ : PULSE TEMPORAL SPACING
$t_4 - t_3$ : PULSE WIDTH

US 7,705,268 B2

METHOD AND SYSTEM FOR LASER SOFT MARKING

CROSS-REFERENCE TO RELATED APPLICATIONS

This application claims the benefit of U.S. provisional application Ser. No. 60/627,760, filed Nov. 11, 2004. This application is related to U.S. application Ser. No. 10/438,501, filed May 15, 2003, which is hereby incorporated by reference herein.

BACKGROUND OF THE INVENTION

1. Field of the Invention

This invention relates to methods and systems for laser soft marking, especially for semiconductor wafers and devices.

2. Background Art

Lasers have been used for laser marking semiconductor wafers for decades. A listing of representative patents and publications generally related to laser marking is now provided. U.S. Pat. No. 5,329,090 relates to dot marking of wafers. The following representative patent references relate to various aspects of laser marking of wafers and electronic assemblies, illumination, and inspection/reading marks: U.S. Pat. Nos. 4,522,656; 4,945,204; 6,309,943; 6,262,388; 5,929,997; 5,690,846; 5,894,530; 5,737,122; and Japanese Patent Abstract 11135390.

The following representative references provide general information on various laser marking methods and system configurations and components: "Galvanometric and Resonant Low Inertia Scanners", Montagu, in Laser Beam Scanning, Marcel-Dekker, 1985, pp. 214-216; "Marking Applications now Encompass Many Materials", Hayes, in Laser Focus World, February 1997, pp. 153-160; "Commercial Fiber Lasers Take on Industrial Markets", Laser Focus World, May 1997, pp. 143-150. Patent Publications: WO 96/16767, WO 98/53949, U.S. Pat. Nos. 5,965,042; 5,942,137; 5,932,119; 5,719,372; 5,635,976; 5,600,478; 5,521,628; 5,357,077; 4,985,780; 4,945,204; 4,922,077; 4,758,848; 4,734,558; 4,856,053; 4,323,755; 4,220,842; 4,156,124.

Published Patent Applications WO 0154854, publication date Aug. 2, 2001, entitled "Laser Scanning Method and System for Marking Articles such as Printed Circuit Boards, Integrated Circuits, and the Like" and WO 0161275, published on Aug. 23, 2001, entitled "Method and System for Automatically Generating Reference Height Data for use in a Three-Dimensional Inspection System" are both assigned to the assignee of the present invention. Both applications are hereby incorporated by reference in their entirety.

The visibility of laser marks as seen by a vision system (or by operator visual inspection) may depend on several factors including mark depth, debris, etc. which in turn depend on laser material-interaction. For certain wafer marking applications the conventional wisdom leads to relatively large marking depths which may provide for good readability, but increasing susceptibility to subsurface damage.

Wafer marking systems have long been provided by the assignee of the present invention. WaferMark™ system, produced by the assignee of the present invention for several years, is believed to be the first industrial laser marking system on silicon wafer. Specifications include a 120 µm marking dot diameter hard marking for 300 nm wafers. This meets the SEMI standard specification M1.15. A "soft marking specification" exists for wafer back side soft marking, including marking rough surface back side wafers up to 200 mm wafer. On the "Sigma Clean" system, a backside-marking option is provided for both front and backside marking for up to 200 mm wafer.

There are roughly two kinds of laser marks currently used by the industry, namely soft marks and hard marks. Various marking systems for producing both "hard marks" and "soft marks" are manufactured by the assignee of the present invention. One such currently available system is the GSILumonics Wafermark® Sigma Clean® is used to produce a type of softmark called Supersoftmark®. This mark is generally characterized as "debris free". These marks are typically produced with diode pumped, q-switched pulse laser systems. Such Supersoftmarks® are produced with the laser system typically operating in a narrow "energy window", a range of energies having an upper limit and lower limit wherein acceptable marking occurs.

U.S. Pat. No. 4,522,656, assigned to the assignee of the present invention, is the foundation of the current laser technology for soft marks. It describes a method which is characterized by the steps of irradiating by means of a laser pulse, a surface segment which has a surface area corresponding to 1.5 times to 6.5 times the surface area of the desired surface pattern, and adjusting the energy of the laser pulse so that only in the center of the surface segment, and on a surface corresponding to the surface pattern, the semiconductor material is melted and partially vaporized. The pattern generated usually has, relative to the original semiconductor surface, a raised annular rim and a recessed center, as shown in FIG. 5.

According to U.S. Pat. No. 4,522,656, the depth of the recess can be controlled by energy density, i.e., the depth of the recess will be increased if there is a corresponding increase of the energy density in the center of the pulse.

It is well known, however, that the process window for the energy density for generating such marks (commonly known as the super soft marks) is very small. Therefore, the adjustment of the depth of the recessed area by changing the energy density on the part is very limited. In addition, there are certain depth ranges that cannot be achieved by simply adjusting the energy or energy density.

For example, one can increase the laser energy from 970 µj to 980 µj to get the upper energy limit of the super soft mark, shown in FIG. 6. Since the energy process window for super soft mark in only around 10 µj in this case, the difference in depth between the two marks is very small. If one has to generate a mark with a depth about 2 µm, for example, it is very difficult, and perhaps impossible, with of laser marking technology developed to date.

As the semiconductor fabrication technologies evolve, soft marks on wafers with different mark depths are required to accommodate the new processes. It is, therefore, very desirable to have a laser marking technique that provides easy adjustment for the marking depth of the super soft marks.

SUMMARY OF THE INVENTION

An object of the present invention is to provide an improved method and system for laser soft marking, especially for semiconductor wafers and devices.

In carrying out the above object and other objects of the present invention, a laser-marking method of marking a semiconductor wafer to form a softmark on the wafer is provided. The method includes setting a laser pulse width of one or more laser pulses to selectively provide one or more laser output pulses having one or more set pulse widths that affect the depth of a softmark that is to be formed. The mark depth is substantially dependent on the one or more set pulse widths. The method further includes setting a pulse energy of the one or more output pulses to selectively provide the one or more output pulses having a set total output energy that is within an acceptable process energy window for producing the softmark. The method still further includes delivering the one or more output pulses having the one or more set pulse widths and the set total output energy into a region of the wafer such that energy density within the region, as determined by the one or more set pulse widths and the set total output energy, modifies wafer material and thereby produces the softmark having the mark depth within a predetermined range.

The mark depth may be substantially proportional to a pulse width over a substantial range of pulse widths.

The mark depth may be in the range of about 1 micron to 6 microns.

The mark depth may be predetermined and formed with exactly one output pulse.

The mark depth may be finer than about 1 micron.

Energy in a single output pulse may be in a typical range of about 600 microjoules to about 1100 microjoules.

The acceptable process energy window may be centered on a central energy in a typical range having a lower limit of about 10 microjoules less than the central energy and an upper limit about 10 microjoules above the central energy.

An output pulse may have a typical set pulse width in the range of about 10 nanoseconds to about 200 nanoseconds.

The step of setting the laser pulse width may be performed subsequent to the step of setting the pulse energy.

The step of setting the pulse energy may be performed subsequent to the step of setting the laser pulse width.

The steps of setting may be performed substantially simultaneously.

Further in carrying out the above object and other objects of the present invention, a laser-marking system for marking a semiconductor wafer to form a softmark on the wafer is provided. The system includes a laser subsystem for generating one or more laser pulses and a controller operatively connected to the laser subsystem. The controller sets a laser pulse width of the one or more laser pulses to selectively provide one or more laser output pulses having one or more set pulse widths that affect the depth of a softmark that is to be formed. The mark depth is substantially dependent on the one or more set pulse widths. The controller further sets a pulse energy of the one or more output pulses to selectively provide the one or more output pulses having a set total output energy that is within an acceptable process energy window for producing the softmark. The system further includes a beam delivery system that includes an optical subsystem for delivering the one or more output pulses having the one or more set pulse widths and the set total output energy into a region of the wafer such that energy density within the region, as determined by the one or more set pulse widths and the set total pulse energy, modifies wafer material and thereby produces the softmark having the mark depth within a predetermined range.

The controller may include a subsystem of electronic components and a control program that is generally used for marking system control.

The controller may further include a subsystem of electronic components and a control program that is dedicated to control of the laser subsystem.

The laser subsystem may include a fiber-based laser having a tunable pulse width.

Yet still further in carrying out the above object and other objects of the present invention, a laser-marking method of forming a softmark on a semiconductor wafer is provided. The method includes setting a temporal characteristic of at least a portion of a pulsed laser output that affects depth of a softmark to be formed with the laser output. The method further includes setting total output energy of the pulsed laser output to correspond to energy within an acceptable process energy window so as to form the softmark on the semiconductor wafer.

The steps of setting may be performed prior to marking a batch of wafers. The temporal characteristic and the total output energy may remain set during marking of the entire batch.

The steps of setting may be performed subsequent to positioning a wafer at a marking station, and prior to marking a single wafer.

The steps of setting may be performed subsequent to positioning a wafer at a marking station and prior to marking a single wafer. The temporal characteristic and the total output energy may be varied to produce softmarks having different predetermined depths on the wafer.

The steps of setting may be performed by a laser-marking system, and the temporal characteristic and the total output energy may be set at a manufacturing site of the laser-marking system or at a site where the laser-marking system is installed.

Further in carrying out the above object and other objects of the present invention, a laser-marking method of forming a softmark on a semiconductor wafer is provided. The method includes setting one or more laser pulse widths of one or more laser pulses. The one or more set pulse widths affect depth of the softmark to be formed with the one or more laser pulses. The method further includes setting total output energy of the one or more laser pulses. The set total output energy corresponds to energy within an acceptable process energy window to form the softmark on the semiconductor wafer.

Embodiments of the present invention may generally be used to produce either softmarks or supersoftmarks®.

One aspect of the invention features a semiconductor wafer having a softmark. The mark may generally be in a range of about 1 micron to about 6 microns. In at least one embodiment of the present invention a softmark-depth may be finer than about 1 micron.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Based on experimental results, the inventors realize that laser pulse width has much more impact on the mark depth than the energy or energy density does in a method and system of an embodiment of the present invention.

Figure 1:
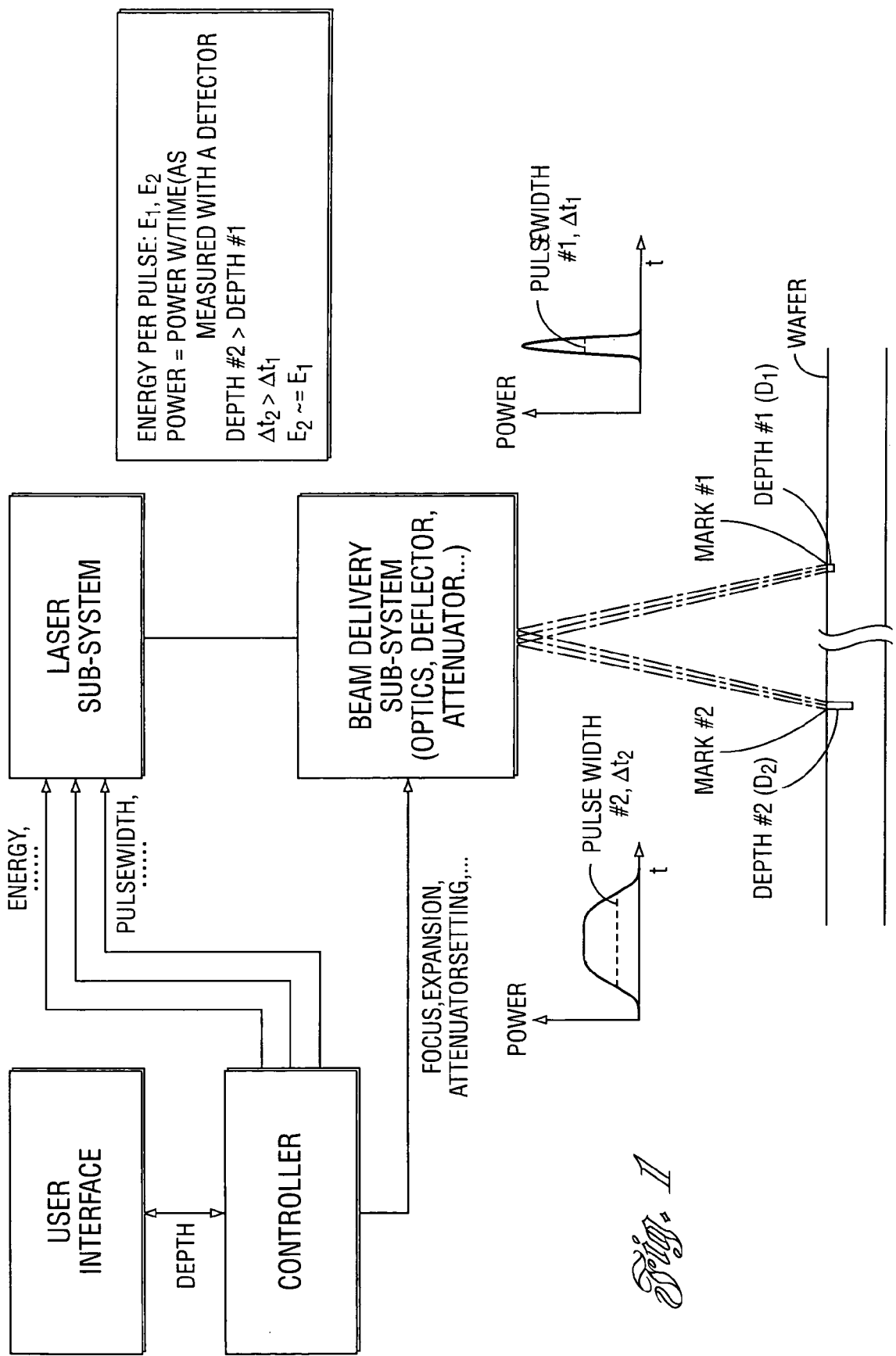
FIG. 1 schematically illustrates first and second softmarks produced within a localized region of a semiconductor wafer using a laser marking system of one embodiment of the present invention (simplified for illustration, not to scale)

FIG. 1 schematically illustrates first and second softmarks produced within a localized region of a semiconductor wafer using a laser marking system of the present invention (simplified for illustration, not to scale). By way of example, marks with depths D1 and D2 are formed with laser first and second pulsed laser outputs having pulse widths t1 and t2 and energies E1 and E2. In this example a portion of the wafer is marked where the wafer optical properties are substantially constant. A laser output is directed to a marking location using a beam deflector, for instance a 2-axis galvanometer scanner. The scanner is included within the delivery system along with various other various optical components for beam expansion, focusing, attenuation, and similar operations on a laser beam.

Figure 2:
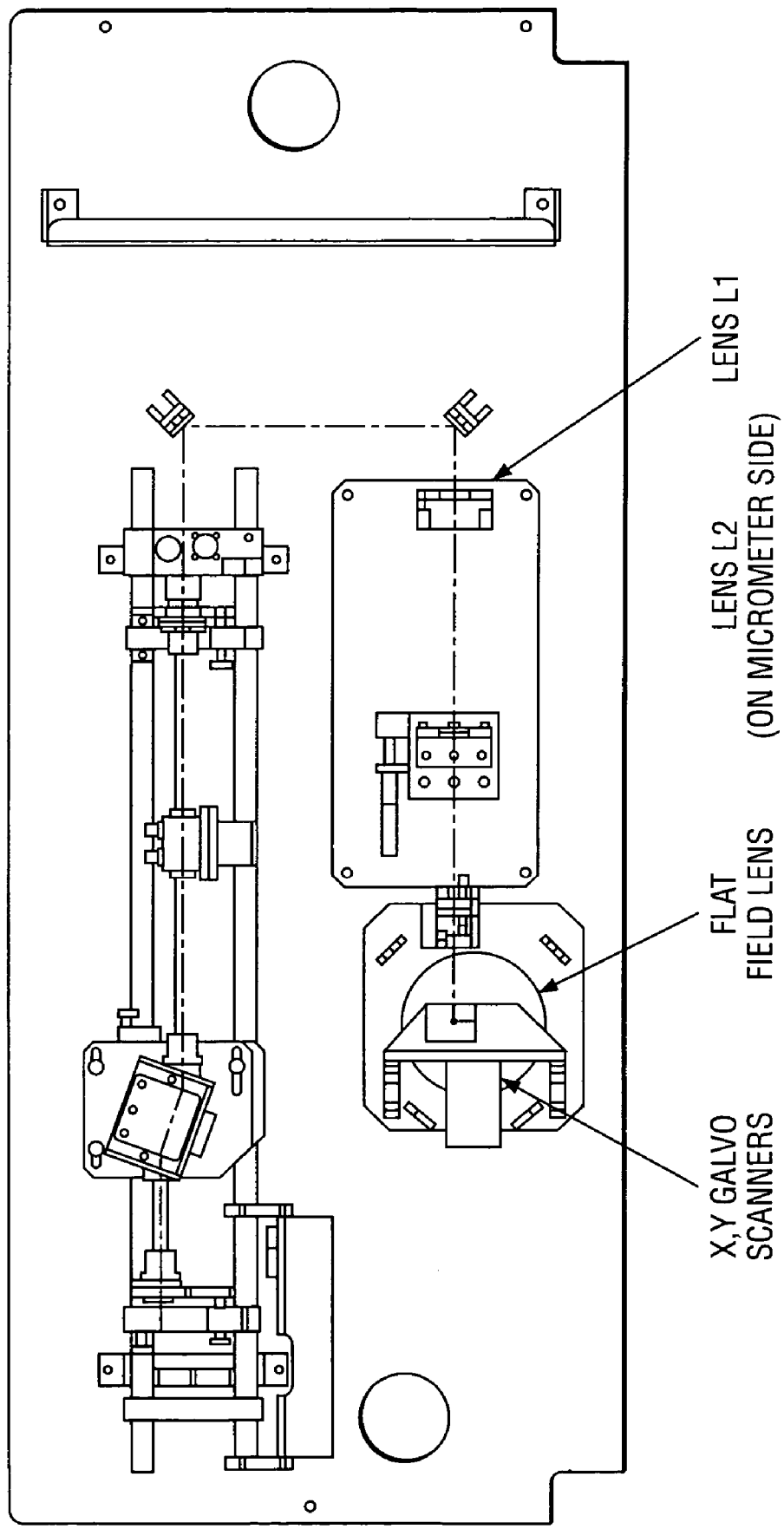
FIG. 2 illustrates an exemplary laser and optical system layout which may be used in a commercial marking system for practicing at least one embodiment of the present invention.

FIG. 2 illustrates an exemplary laser and optical system layout which may be used in a commercial marking system for practicing at least one embodiment of the present invention. The Sigma 100 laser refers to a commercially available, diode-pumped, solid state laser produced by the assignee of the present invention. Various combinations of beam shaping optics (e.g: beam expanders), scan lenses, and scan mirror configurations may be utilized in embodiments of the present invention.

Figure 7:
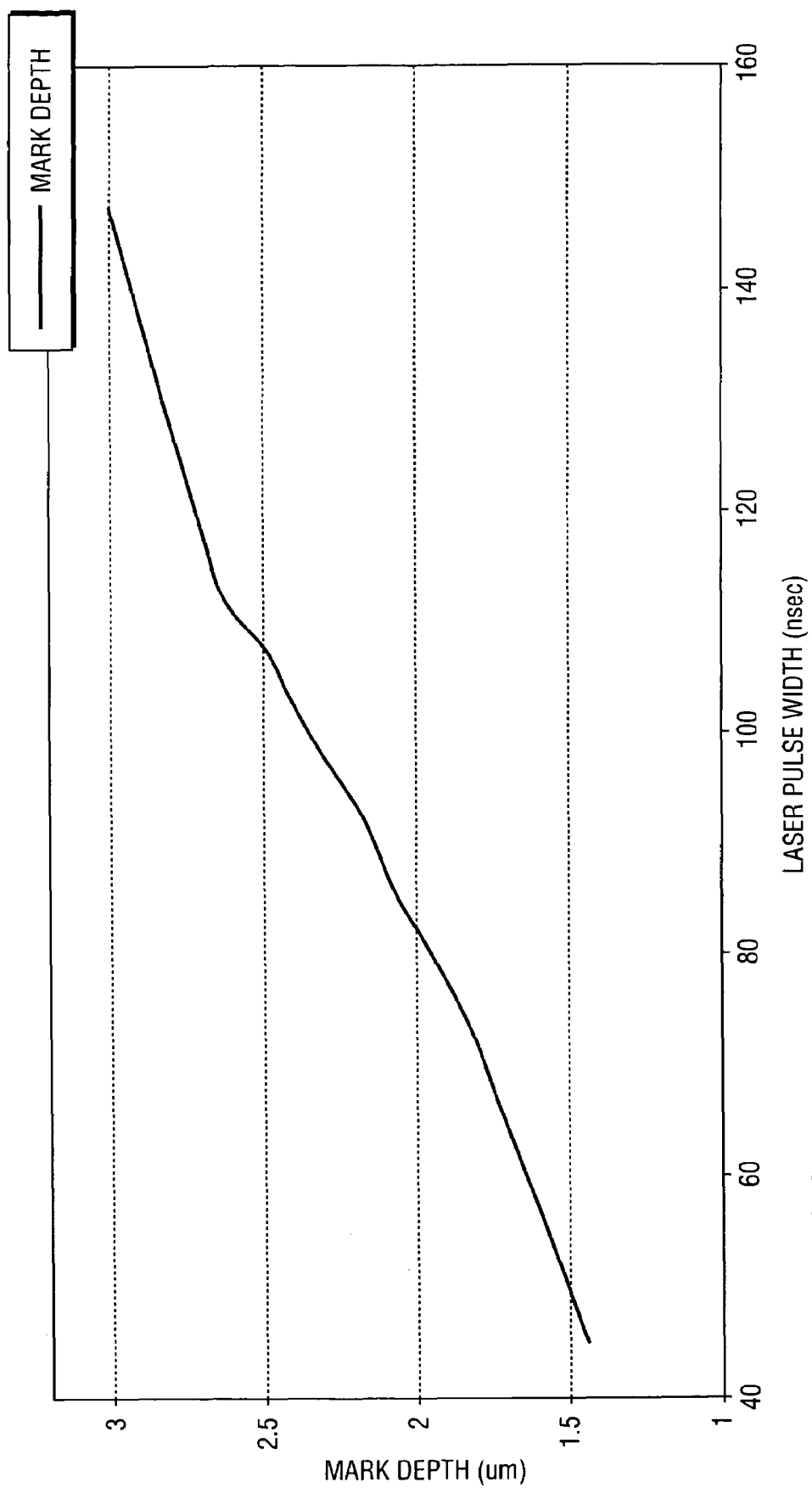
FIG. 7 is a graph of mark depth versus laser pulse width for a given energy density.

The graph of FIG. 7 shows experimental results of mark depth dependence on the laser pulse width for a given energy density.

Figure 8:
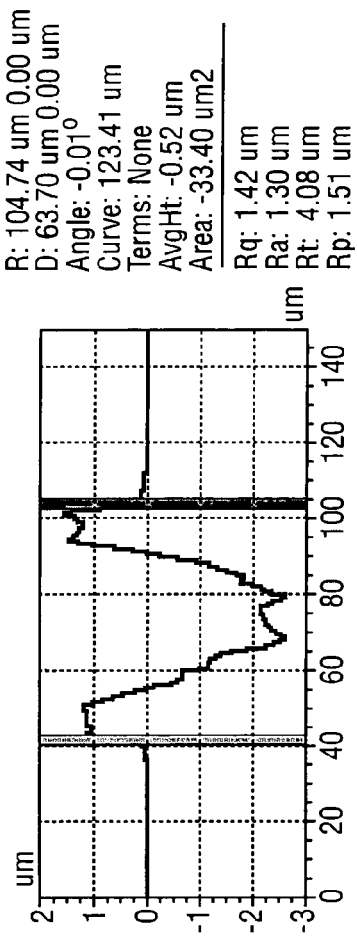
FIG. 8 is a top view of a super soft mark, graphs and data with the mark having a depth of 2.6 μm.
Figure 8:
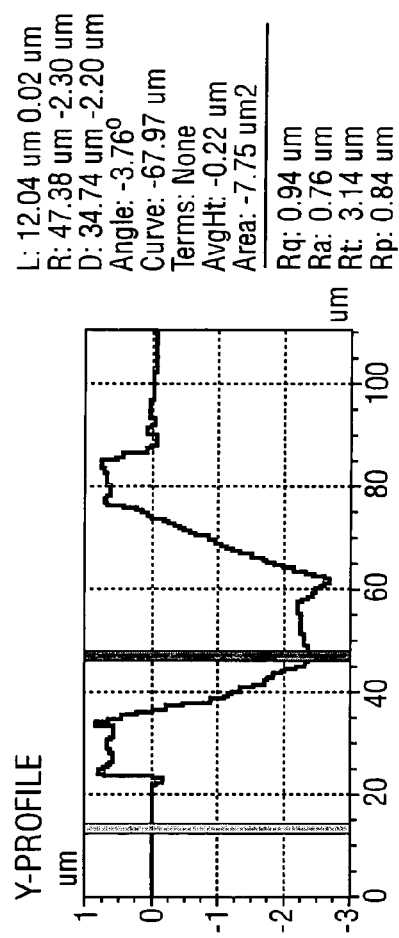
Figure 8:
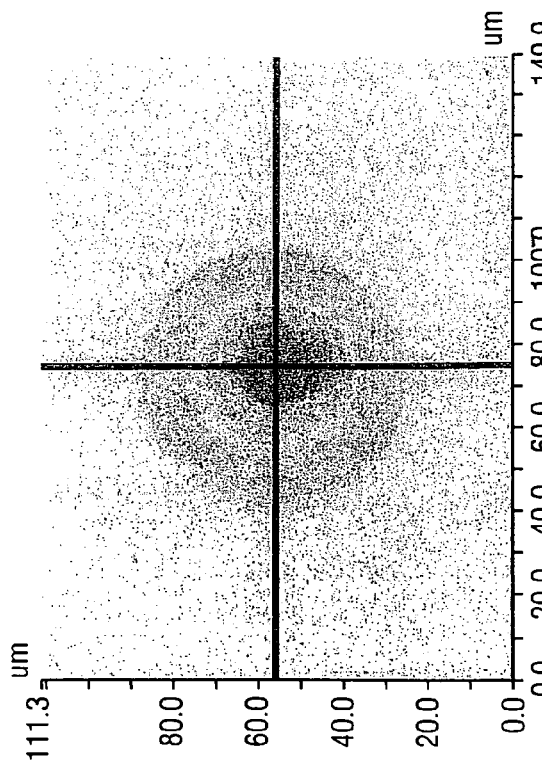
Figure 9:
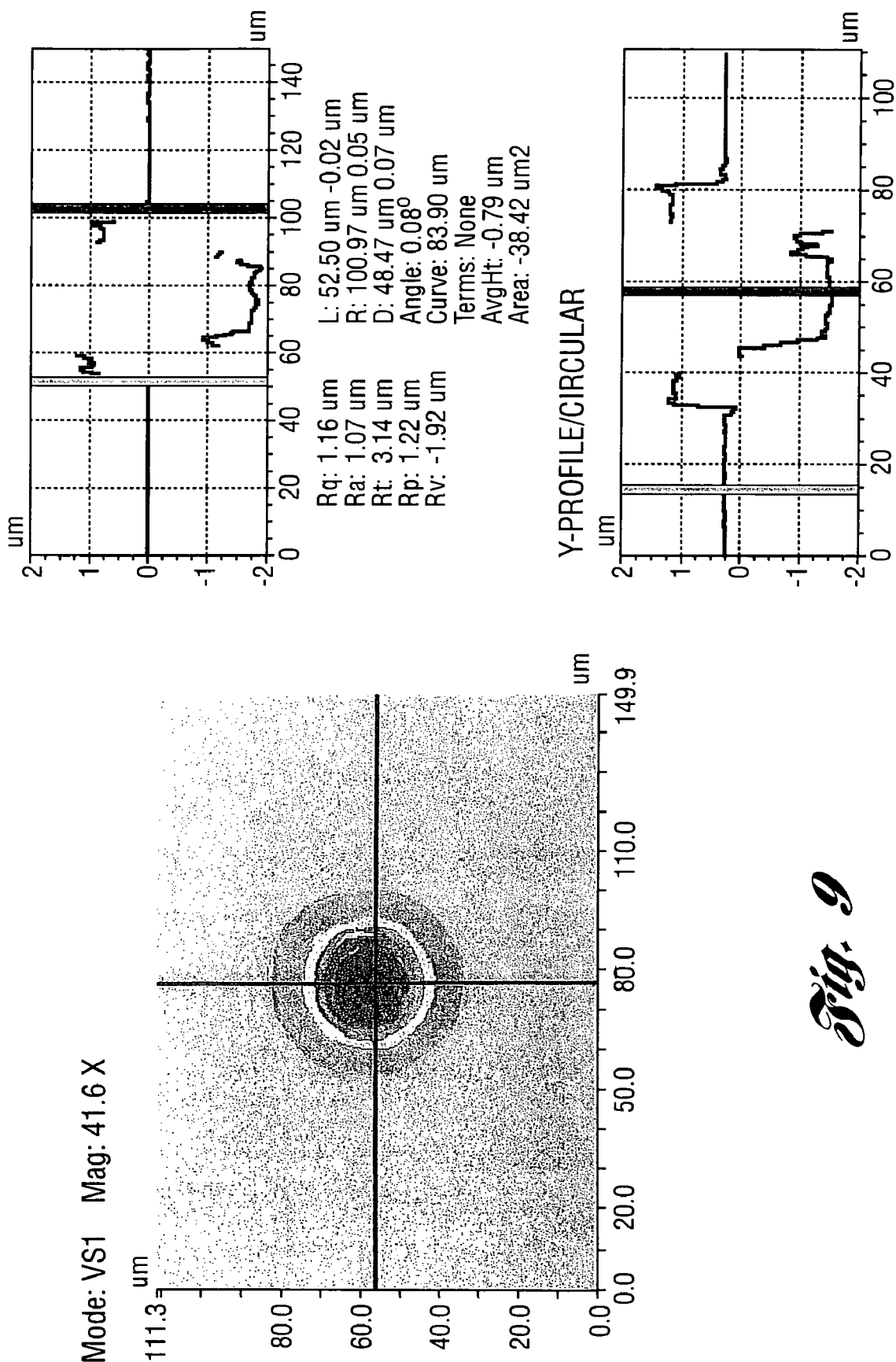
FIG. 9 is a top view of a super soft mark, graphs and data with the mark having a depth of 1.8 μm.

FIGS. 8 and 9 show typical super soft marks with mark depths 2.6 μm and 1.8 μm for pulse widths 124 ns and 72 ns, respectively.

The laser energy, and corresponding energy density, used in embodiments of the present invention will generally be based on wafer optical properties. In many cases the wafers will be bare and polished. The wafer may be polished so as to conform to a surface roughness standard. The surface reflectance can be expected to vary from batch to batch, and possibly over a wafer. Oxidation can lead to a requirement for adjustment of the incident energy. Typically the incident energy will be in a range of about 600 microjoules-1100 microjoules (e.g.: nearly a 2:1 variation).

Preferably the marking will occur at the position of best focus at each marking location over a marking field. However, the marking may also occur at positions other than best focus and may occur with off-normal incident marking beams.

Preferably, a laser pulse width will be easy to set, and may be programmable. One such example is a fiber laser from IPG Photonics that is used by the assignee of the present invention in certain M430 memory repair systems. Laser pulse widths can be selected over a continuous range from 4 ns to 20 ns. In at least one preferred embodiment a mark depth, a corresponding laser pulse width, or laser output energy laser pulse width may be selected through the use of the user interface provided with the marking system.

Published U.S. patent application 2004/0188399, assigned to the assignee of the present invention, discloses various laser system embodiments useable for creating or removing a feature on a surface. By way of example, a MOPA system having a fiber optic amplifier is disclosed. The laser processing system may include an output sub-system having an A-O modulator. The MOPA and output modulator are controlled to selectively direct one or more laser pulses to the target material based on position information. Each of the output pulses incident of the surface may have a different pulsewidth.

Figure 3A:
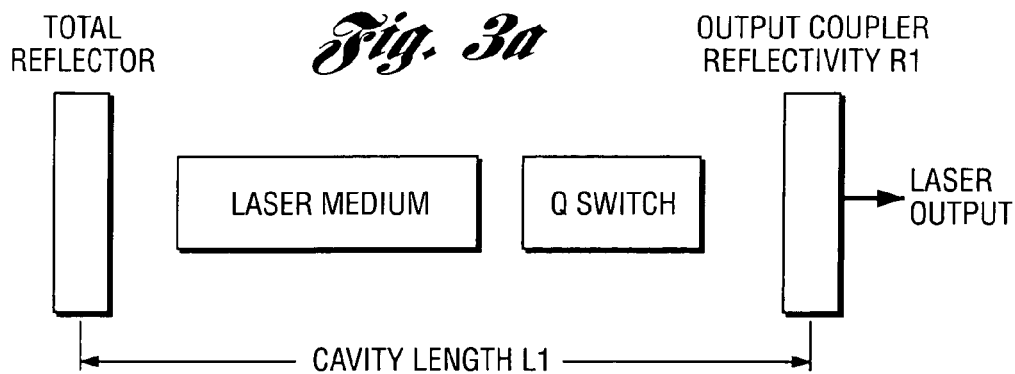
FIGS. 3a and 3b schematically illustrate, by way of example, a laser cavity (FIG. 3a) and a modification of the cavity length to change the laser output pulse width (FIG. 3b)
Figure 3B:
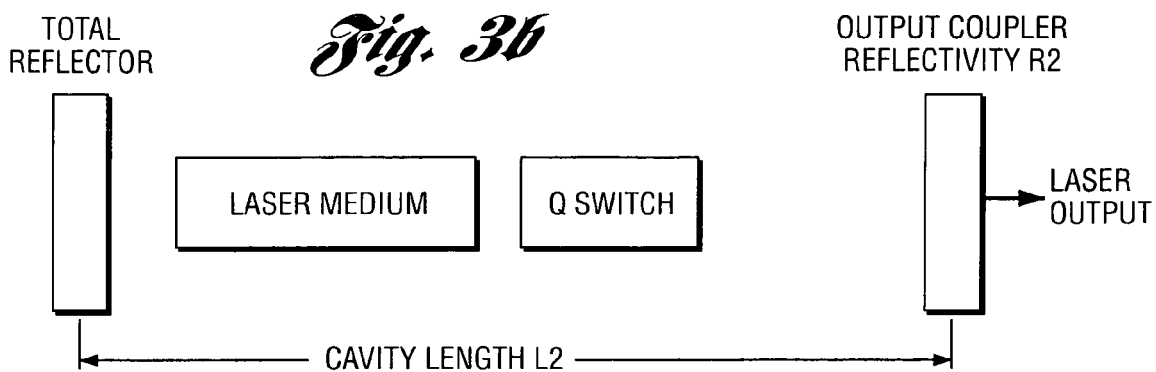

Another way to set a pulse width is to adjust the laser cavity geometry and dimensions, as well as the reflectivity of the output coupler. FIG. 3a shows a typical laser cavity with the output coupler reflectivity, R1, and a total cavity length, L1. A folded cavity can also be represented with an effective cavity length in this case. FIG. 3b shows how the laser pulse width can be changed by varying the cavity length to L2 and the output coupler reflectivity to R2. The curvatures of both cavity mirrors (the total reflector and the output coupler) can also be changed when the total cavity length is changed in order to keep the laser resonator configuration the same. Theory and operation of laser resonators can be found in many text books, handbooks, and catalogs provided by laser manufacturers. One such reference is "Lasers" by Peter Milonni and Joseph Eberrly, published by John Wiley & Sons 1988. Chapter 14 entitled "Laser Resonators" describes in detail the theory and principles of the laser cavity.

Another way to set a pulse width is to take advantage of a common laser characteristic, i.e., the pulse width decreases with the increase of the laser energy. So in order to achieve shallower mark depth, one can run the laser to a higher pulse energy level to obtain the needed pulse width, and then externally attenuate the beam to achieve the required energy density to get the super soft marks.

One may also exploit another common laser characteristic, i.e., the pulse width increases with the repetition rate of the laser. Operating the laser at a higher repetition rate (thus, a longer pulse width), will give rise to a deeper mark depth for a given energy density.

Commercially available q-switched, diode pumped laser systems include provisions for adjusting the repetition rate. Such models are available from Lightwave Electronics and Spectra Physics. In some embodiments, the laser systems may be combined with an output attenuator to control the total energy on the surface.

Therefore, commercially available laser technology can be adapted to carry out numerous embodiments of the present invention. The laser system may be q-switched or gain switched, and various combinations thereof.

In certain embodiments various temporal laser output characteristics may be set to affect mark depth, and the total laser output energy is also to be set within an acceptable process energy window. For instance, the laser system may be operated in a "burst mode". The burst may generally be characterized with an envelope that is slowly varying with respect to a waveform or sequence of pulses within the envelope. The corresponding pulsed laser output used to form the softmark may be such a burst of pulses, and the temporal characteristic may be at least one of a burst width, burst envelope shape, burst duration, temporal spacing between bursts, a pulse width, temporal spacing between two or more pulses, temporal overlap between two or more pulses, a set delay between at least two pulses, and a pulse shape.

Figure 4A:
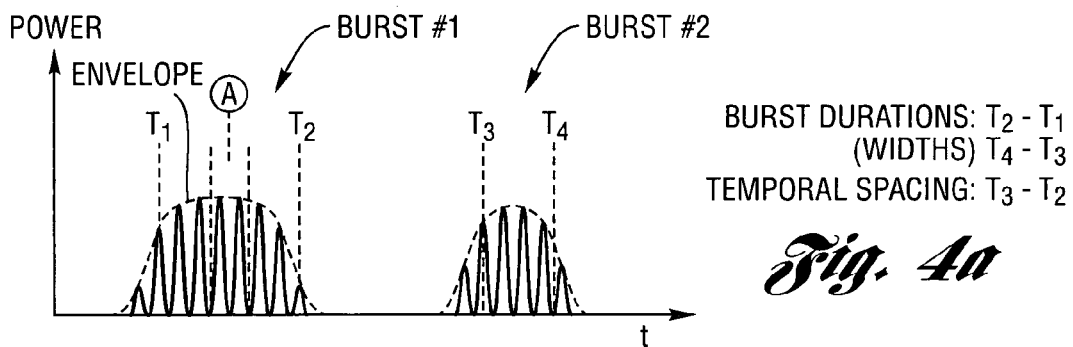
FIGS. 4a-4c illustrate exemplary temporal pulse characteristics of a burst of pulses, and shows an expanded view of one or more pulses within a burst.
Figure 4B:
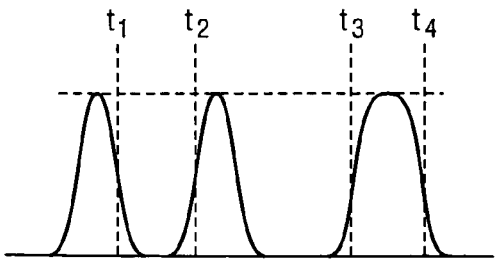
Figure 4C:
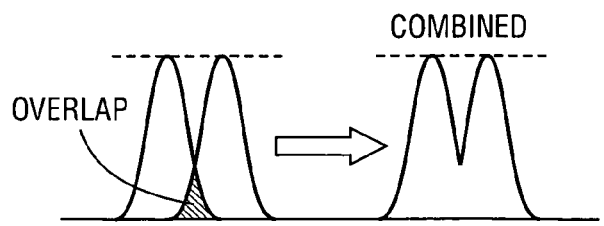
Figure 5:
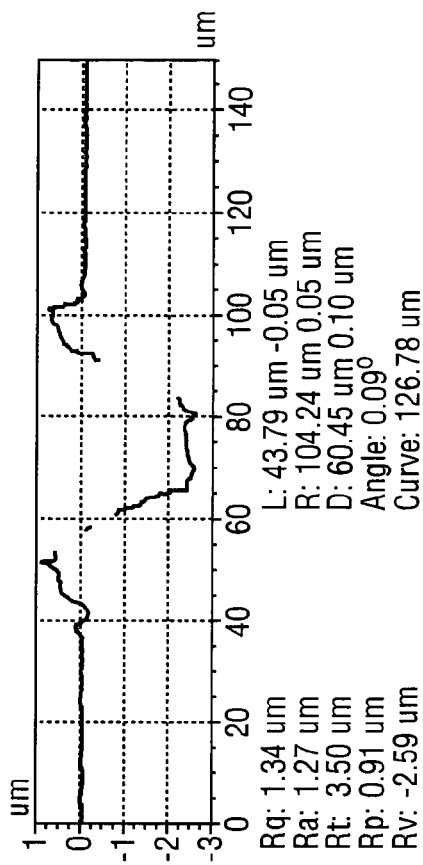
FIG. 5 is a top view of a prior art super soft mark, graphs and data laser pulse energy 970 μj.
Figure 5:
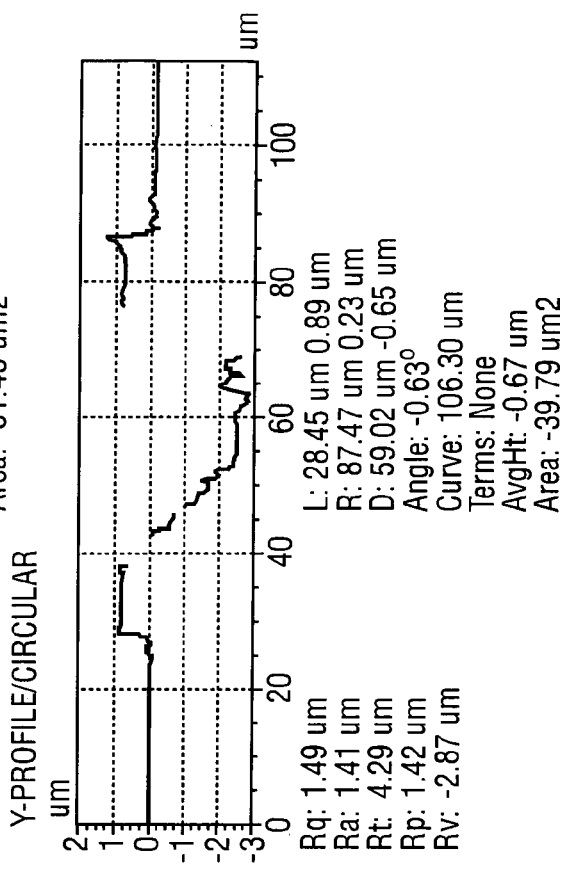
Figure 5:
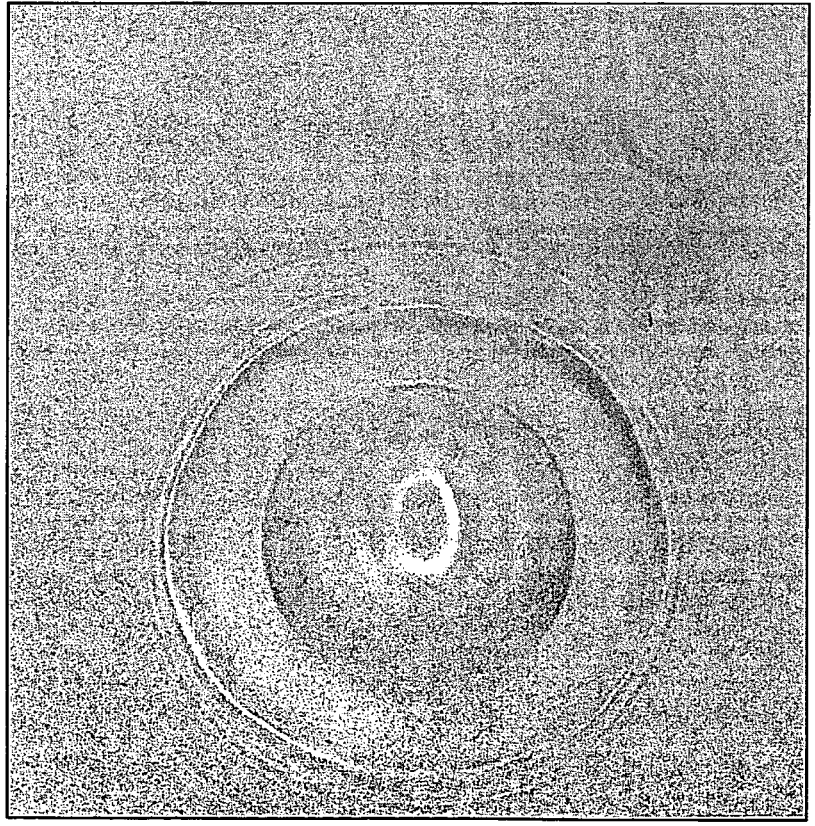
Figure 6:
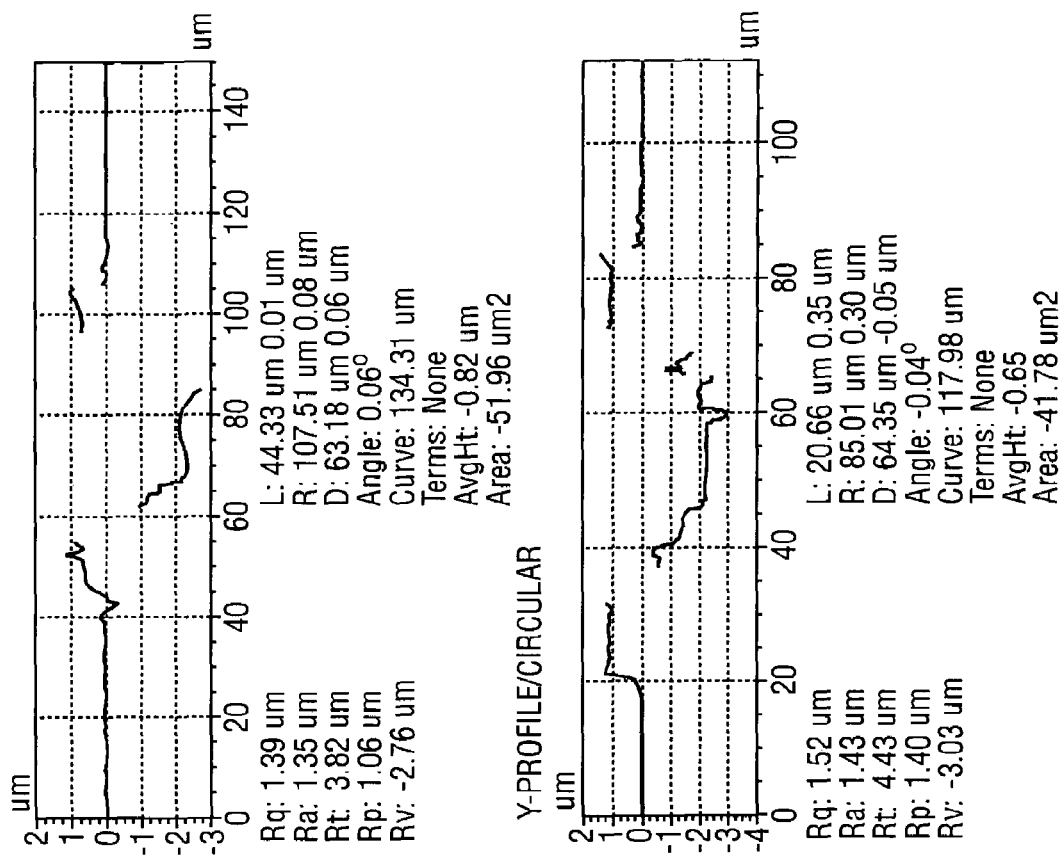
FIG. 6 is a top view of a prior art super soft mark, graphs and data laser pulse energy 980 μj.
Figure 6:
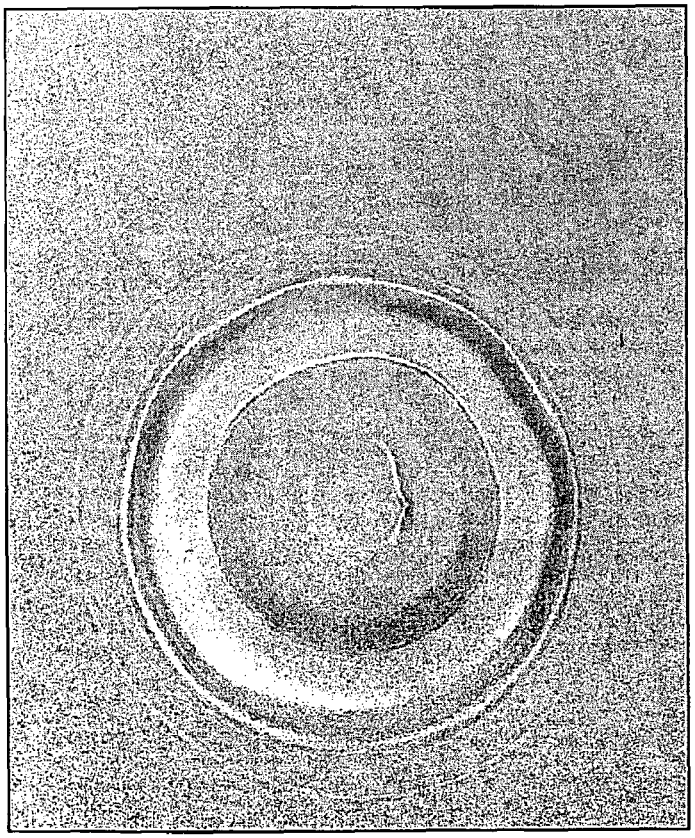

FIGS. 4a-4c illustrate exemplary temporal pulse characteristics the may be set in at least one embodiment of the present invention. Numerous references teach "burst mode" operation, pulse shaping, pulse stretching, pulse delay, and pulse selection. For instance, published U.S. patent application 2002/0167581 (at least FIGS. 15a, 15b, 15c, 18, and 19, and corresponding portions of the written specification)

shows various configurations that may be used or adapted for use in embodiments of the present invention. In embodiments where multiple pulses are used to produce softmarks, a delay between pulses on the order or about ten nanoseconds or less may be best for material modification. The pulse delay or spacing may be determined based on a thermal time constant of the Silicon substrate. Published U.S. patent application 2004/0188399, assigned to the assignee of the present invention (noted above) and various reference cited therein also generally relate to generation and manipulation of pulsed laser outputs.

In practice, the pulse temporal characteristics and energy may be set for a lot or batch wafers, without a requirement for further adjustment. Future requirements may lead to setting of the pulse characteristics for marking different depths within a field. The surface variations of the wafers lead to a requirement for "process studies" to determine the laser output energy requirement, and such variations generally determine the frequency of such measurements. Preferably, the laser marking system includes detection and calibration hardware and software to perform any needed process studies with minimum operator intervention.

Embodiments of the present invention are typically used for "dot" formats on a first side of the wafer may be polished to a standard. Various embodiments of the present invention may be integrated with the series of marking products produced by the assignee of the present invention, for instance the GSILumonics Wafermark® Sigma Clean®.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A laser-marking method of marking a semiconductor wafer to form a softmark on the wafer, the method comprising:
    setting a laser pulse width of one or more laser pulses to selectively provide one or more laser output pulses having one or more set pulse widths that affect the depth of a softmark that is to be formed, the mark depth to be substantially dependent on the one or more set pulse widths;
    setting a pulse energy of the one or more output pulses to selectively provide the one or more output pulses having a set total output energy that is within an acceptable process energy window for producing the softmark;
    delivering the one or more output pulses having the one or more set pulse widths and the set total output energy into a region of the wafer such that energy density within the region, as determined by the one or more set pulse widths and the set total output energy, modifies wafer material and thereby produces the softmark having a raised annular rim and a recessed center with the mark depth within a predetermined range wherein the softmark is debris free; and
    controllably resetting the laser pulse width without substantially changing the energy density to change the mark depth within the predetermined range wherein the mark depth is controllably adjusted and wherein the mark depth is substantially proportional to a pulse width over a substantial range of pulse widths;
    wherein energy in a single output pulse is in a range of about 600 microjoules to about 1100 microjoules; and
    wherein the acceptable process energy window is centered on a central energy in a range having a lower limit of about 10 microjoules less than the central energy and an upper limit about 10 microjoules above the central energy and wherein diameter of the softmark is about 48 microns or greater.

2. The method as claimed in claim 1, wherein the steps of setting are performed substantially simultaneously.

3. The method as claimed in claim 1, wherein the mark depth is in the range of about 1 micron to 6 microns.

4. The method as claimed in claim 1, wherein the mark depth is predetermined and formed with exactly one output pulse.

5. The method as claimed in claim 1, wherein the mark depth is finer than about 1 micron.

6. The method as claimed in claim 1, wherein an output pulse has a set pulse width in the range of about 10 nanoseconds to about 200 nanoseconds.

7. The method as claimed in claim 1, wherein the step of setting the laser pulse width is performed subsequent to the step of setting the pulse energy.

8. The method as claimed in claim 1, wherein the step of setting the pulse energy is performed subsequent to the step of setting the laser pulse width.

9. A laser-marking system for marking a semiconductor wafer to form a softmark on the wafer, the system comprising:
    a laser subsystem for generating one or more laser pulses;
    a controller operatively connected to the laser subsystem to:
        set a laser pulse width of the one or more laser pulses to selectively provide one or more laser output pulses having one or more set pulse widths that affect the depth of a softmark that is to be formed, the mark depth to be substantially dependent on the one or more set pulse widths;
        set a pulse energy of the one or more output pulses to selectively provide the one or more output pulses having a set total output energy that is within an acceptable process energy window for producing the softmark; and
        controllably reset the pulse width without substantially changing the energy density to change the mark depth wherein the mark depth is controllably adjusted; and
    a beam delivery system that includes an optical subsystem for delivering the one or more output pulses having the one or more set pulse widths and the set total output energy into a region of the wafer such that energy density within the region, as determined by the one or more set pulse widths and the set total pulse energy, modifies wafer material and thereby produces the softmark having a raised annular rim and a recessed center with the mark depth within a predetermined range wherein the softmark is debris free and wherein the mark depth is substantially proportional to a pulse width over a substantial range of pulse widths;
    wherein energy in a single output pulse is in a range of about 600 microjoules to about 1100 microjoules; and
    wherein the acceptable process energy window is centered on a central energy in a range having a lower limit of about 10 microjoules less than the central energy and an upper limit about 10 microjoules above the central energy and wherein diameter of the softmark is about 48 microns or greater.

10. The system as claimed in claim 9, wherein the controller includes a subsystem of electronic components and a control program that is generally used for marking system control.

11. The system as claimed in claim 9, wherein the controller includes a subsystem of electronic components and a control program that is dedicated to control of the laser subsystem.

12. The system as claimed in claim 9, wherein the laser subsystem includes a fiber-based laser having a tunable pulse width.

13. A laser-marking method of forming a softmark on a semiconductor wafer, the method comprising:
setting one or more laser pulse widths of one or more laser pulses, the one or more set pulse widths affecting depth of the softmark to be formed with the one or more laser pulses;
setting total output energy of the one or more laser pulses, the set total output energy corresponding to energy within an acceptable process energy window to form the softmark on the semiconductor wafer, the softmark having a raised annular rim and a recessed center with the mark depth and wherein the softmark is debris free; and
controllably resetting the one or more laser pulse widths without substantially changing the energy density to change the depth of the softmark wherein the mark depth is controllably adjusted and wherein the mark depth is substantially proportional to a pulse width over a substantial range of pulse widths;
wherein energy in a single output pulse is in a range of about 600 microjoules to about 1100 microjoules; and
wherein the acceptable process energy window is centered on a central energy in a range having a lower limit of about 10 microjoules less than the central energy and an upper limit about 10 microjoules above the central energy and wherein diameter of the softmark is about 48 microns or greater.

14. A laser-marking method of forming softmarks having a raised annular rim and different predetermined recessed center depths on semiconductor wafers, the method comprising:
setting a laser pulse width or a burst width of one or more laser pulses, the set pulse width or set burst width corresponding to a desired depth of a softmark to be formed with the one or more laser pulses;
setting total output energy of the one or more laser pulses;
setting total output energy of the one or more laser pulses to a value within a process energy window to form a softmark having the desired depth on the semiconductor wafer;
forming the softmark having the desired depth on a semiconductor wafer with the one or more laser pulses, the softmark having a raised annular rim and a recessed center with the desired depth wherein the softmark is debris free;
controllably resetting the laser pulse width or burst width to change the mark depth based on a determined dependence of the softmark depth on the laser pulse width or burst width; and
forming a softmark having a different depth on a semiconductor wafer wherein the mark depth is substantially proportional to a pulse width over a substantial range of pulse widths;
wherein energy in a single output pulse is in a range of about 600 microjoules to about 1100 microjoules; and
wherein the acceptable process energy window is centered on a central energy in a range having a lower limit of about 10 microjoules less than the central energy and an upper limit about 10 microjoules above the central energy and wherein diameter of the softmark is about 48 microns or greater.

15. A laser-marking method of forming a softmark on a semiconductor wafer, the method comprising:
setting a temporal characteristic of at least a portion of a pulsed laser output that affects depth of a softmark to be formed with the laser output, the softmark having a raised annular rim and a recessed center with the mark depth and wherein the softmark is debris free;
setting total output energy of the pulsed laser output to correspond to energy within an acceptable process energy window so as to form the softmark on the semiconductor wafer; and
controllably resetting the temporal characteristic without substantially changing the energy density to change the mark depth wherein the mark depth is controllably adjusted and wherein the mark depth is substantially proportional to a pulse width over a substantial range of pulse widths;
wherein energy in a single output pulse is in a range of about 600 microjoules to about 1100 microjoules; and
wherein the acceptable process energy window is centered on a central energy in a range having a lower limit of about 10 microjoules less than the central energy and an upper limit about 10 microjoules above the central energy and wherein diameter of the softmark is about 48 microns or greater.

16. The method as claimed in claim 15, further comprising marking a batch of wafers with the softmarks, and wherein the temporal characteristic and the total output energy remain set during marking of the entire batch.

17. The method as claimed in claim 15, further comprising positioning a wafer at a marking station prior to marking a single wafer with softmarks.

18. The method as claimed in claim 15, further comprising positioning a wafer at a marking station prior to marking a single wafer with softmarks, and wherein the temporal characteristic and the total output energy are varied to produce softmarks having different predetermined depths on the wafer.

19. The method as claimed in claim 15, wherein the steps of setting are performed by a laser-marking system user interface or control program and wherein the temporal characteristic corresponds to softmark depth and the acceptable process energy window is predetermined.

20. A laser-marking method of marking a semiconductor wafer to form a softmark having a raised annular rim and a variable recessed center depth on the wafer, the method comprising:
selecting a desired softmark depth within a softmark depth range, the selected depth corresponding to a predetermined laser pulse width or burst width for a given energy density;
setting one of a laser pulse width of a single pulse or a burst width of a sequence of pulses to selectively provide one or more laser output pulses having a set pulse width or a set burst width corresponding to the desired softmark depth;
setting a total energy output of the one or more output pulses to selectively provide the one or more output pulses having a set total output energy that is within a process energy window for producing the softmark having the desired softmark depth; and
delivering the one or more output pulses having the set pulse width or the set burst width and the set total output energy into a region of the wafer such that energy density within the region, as determined by the set total output energy, modifies wafer material and thereby produces the softmark having a raised annular rim and a recessed center with the desired softmark depth wherein the softmark is debris free and wherein the desired softmark depth is substantially proportional to a pulse width over a substantial range of pulse widths;

wherein energy in a single output pulse is in a range of about 600 microjoules to about 1100 microjoules; and wherein the acceptable process energy window is centered on a central energy in a range having a lower limit of about 10 microjoules less than the central energy and an upper limit about 10 microjoules above the central energy and wherein diameter of the softmark is about 48 microns or greater.

21. The method as claimed in claim 20, wherein the mark depth is in the range of about 1 micron to 6 microns.

22. The method as claimed in claim 21, wherein the mark depth range is 1.8 microns to 2.6 microns corresponding to respective pulse widths of 72 ns to 124 ns.

23. The method as claimed in claim 20, wherein the mark depth is predetermined and formed with exactly one output pulse.

24. The method as claimed in claim 20, wherein the mark depth is finer than about 1 micron.

25. The method as claimed in claim 20, wherein diameter of the softmark is about 48 microns to about 64 microns.

26. The method as claimed in claim 20, wherein energy within the process energy window varies by a ratio of less than 2:1.

27. The method as claimed in claim 20, wherein an output pulse has a typical set pulse width in the range of about 10 nanoseconds to about 200 nanoseconds.

28. A laser-marking system for marking a semiconductor wafer to form a softmark having a raised annular rim and a variable recessed center depth on the wafer, the system comprising:
a laser subsystem for generating one or more laser pulses with a settable pulse width or a settable burst width in a predetermined range of values corresponding to a predetermined range of softmark depths;
a controller operatively connected to the laser subsystem to:
receive data corresponding to a desired softmark depth within the predetermined range of softmark depths;
set a laser pulse width or burst width of the one or more laser pulses to selectively provide one or more laser output pulses having a set pulse width or a set burst width corresponding to the desired softmark depth; and
set a pulse energy of the one or more output pulses to selectively provide the one or more output pulses having a set total output energy that is within a process energy window for producing the softmark; and
a beam delivery system that includes an optical subsystem for delivering the one or more output pulses having the set pulse width or set burst width and the set total output energy into a region of the wafer such that energy density within the region, the set total pulse energy modifies wafer material and thereby produces the softmark having a raised annular rim and a recessed center with the desired softmark depth wherein the softmark is debris free and wherein the mark depth is substantially proportional to a pulse width over a substantial range of pulse widths;

wherein energy in a single output pulse is in a range of about 600 microjoules to about 1100 microjoules; and wherein the acceptable process energy window is centered on a central energy in a range having a lower limit of about 10 microjoules less than the central energy and an upper limit about 10 microjoules above the central energy and wherein diameter of the softmark is about 48 microns or greater.

29. The system as claimed in claim 28, wherein the controller includes a subsystem of electronic components and a control program that is generally used for marking system control.

30. The system as claimed in claim 28, wherein the controller includes a subsystem of electronic components and a control program that is dedicated to control of the laser subsystem.

31. The system as claimed in claim 28, further comprising:
a user interface operable to select at least one of a mark depth, a laser pulse width corresponding to a mark depth, and laser output energy.

32. The system as claimed in claim 28, wherein the laser subsystem includes a fiber-based laser having tunable pulse width.

33. A laser-marking method of forming softmarks having a raised annular rim and different predetermined recessed center depths on semiconductor wafers, the method comprising:
setting a temporal characteristic of at least a portion of a pulsed laser output that corresponds to a desired depth of a softmark to be formed with the laser output;
setting total output energy of the pulsed laser output to a value within a process energy window for producing the softmark having the desired depth;
forming the softmark having the desired depth on a semiconductor wafer with the laser output, the softmark having a raised annular rim and a recessed center with the desired depth and wherein the softmark is debris free;
controllably resetting the temporal characteristic to change the mark depth based on a determined dependence of the softmark depth on the temporal characteristic; and
forming a softmark having a different depth on the semiconductor wafer wherein the mark depth is substantially proportional to a pulse width over a substantial range of pulse widths;

wherein energy in a single output pulse is in a range of about 600 microjoules to about 1100 microjoules; and wherein the acceptable process energy window is centered on a central energy in a range having a lower limit of about 10 microjoules less than the central energy and an upper limit about 10 microjoules above the central energy and wherein diameter of the softmark is about 48 microns or greater.

34. The method as claimed in claim 33, wherein the temporal characteristic is one of a pulse width, a burst width, a burst envelope shape, a burst duration, a temporal spacing between bursts, a temporal spacing between two or more pulses, a temporal overlap between two or more pulses, a delay between two or more pulses, and a pulse shape.

35. The method as claimed in claim 33, further comprising marking a batch of wafers with the softmarks, and wherein the temporal characteristic and the total output energy remain set during marking of the entire batch.

36. The method as claimed in claim 35, further comprising:
positioning each wafer in the batch at a marking station.

37. The method as claimed in claim 33, wherein the temporal characteristic and the total output energy are varied to produce softmarks having different predetermined depths.

38. The method as claimed in claim 33, wherein the step of setting are performed by a laser-marking system and wherein the temporal characteristic and the total output energy are set using a user interface of the laser-marking system.

39. A laser-marking method of forming a softmark having a raised annular rim and a variable recessed center depth on a semiconductor wafer, the method comprising:

setting a temporal characteristic of at least a portion of a pulsed laser output that corresponds to a desired depth of a softmark to be formed with the laser output;

setting total output energy of the pulsed laser output to correspond to energy within a process energy window so as to form the softmark on the semiconductor wafer; and forming the softmark having the desired depth on a semiconductor wafer, the softmark having a raised annular rim and a recessed center wherein the softmark is debris free; wherein the steps of setting and the step of forming are performed by a laser-marking system and wherein the temporal characteristic and the total output energy are set using a user interface of the laser-marking system wherein the mark depth is substantially proportional to a pulse width over a substantial range of pulse widths;

wherein energy in a single output pulse is in a range of about 600 microjoules to about 1100 microjoules; and wherein the acceptable process energy window is centered on a central energy in a range having a lower limit of about 10 microjoules less than the central energy and an upper limit about 10 microjoules above the central energy and wherein diameter of the softmark is about 48 microns or greater.

* * * * *